United States Patent
Choi et al.

(10) Patent No.: US 10,335,984 B2
(45) Date of Patent: Jul. 2, 2019

(54) IMPRINT APPARATUS AND ARTICLE MANUFACTURING METHOD

(71) Applicant: CANON KABUSHIKI KAISHA, Tokyo (JP)

(72) Inventors: Byung-jin Choi, Austin, TX (US); Anshuman Cherala, Austin, TX (US); Zhengmao Ye, Austin, TX (US); Xiaoming Lu, Cedar Park, TX (US); Kang Luo, Austin, TX (US); Nobuto Kawahara, Utsunomiya (JP); Yoshikazu Miyajima, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 275 days.

(21) Appl. No.: 15/302,680

(22) PCT Filed: Apr. 7, 2015

(86) PCT No.: PCT/JP2015/001970
§ 371 (c)(1),
(2) Date: Oct. 7, 2016

(87) PCT Pub. No.: WO2015/155988
PCT Pub. Date: Oct. 15, 2015

(65) Prior Publication Data
US 2017/0028598 A1 Feb. 2, 2017

(30) Foreign Application Priority Data
Apr. 9, 2014 (JP) .................. 2014-079980

(51) Int. Cl.
*H01L 21/683* (2006.01)
*G03F 7/00* (2006.01)
(Continued)

(52) U.S. Cl.
CPC ............ *B29C 43/58* (2013.01); *B29C 43/021* (2013.01); *G03F 7/0002* (2013.01);
(Continued)

(58) Field of Classification Search
CPC .................................................. H01L 21/6838
See application file for complete search history.

(56) References Cited

U.S. PATENT DOCUMENTS 5,436,693 A * 7/1995 Marumo ............... B25B 11/005
269/21
5,563,683 A * 10/1996 Kamiya .................. G03F 7/707
355/53
(Continued)

FOREIGN PATENT DOCUMENTS

CN 103135341 A 6/2013
JP 2010098310 A 4/2010
(Continued)

OTHER PUBLICATIONS

International Search Report issued in Intl. Appln. No. PCT/JP2015/001970, dated Jul. 14, 2015.
(Continued)

*Primary Examiner* — Alison L Hindenlang
*Assistant Examiner* — George W. Brady
(74) *Attorney, Agent, or Firm* — Rossi, Kimms & McDowell LLP

(57) ABSTRACT

Provided is an imprint apparatus for contacting a resin applied to a substrate with a mold to perform patterning on the substrate. The imprint apparatus includes a substrate holding unit for holding the substrate, wherein the substrate holding unit comprises a plurality of holding areas arranged in a predetermined direction, the plurality of holding areas has different width dimension in the direction respectively based on positions in the direction, a surface ratio between
(Continued)

two holding areas of the plurality of holding areas with different width dimension respectively is within a range of 0.8 to 1.2.

15 Claims, 5 Drawing Sheets

(51) Int. Cl.
    *B29C 43/02*    (2006.01)
    *B29C 43/32*    (2006.01)
    *B29C 43/58*    (2006.01)
    *B29C 43/36*    (2006.01)

(52) U.S. Cl.
    CPC .... *H01L 21/6838* (2013.01); *B29C 2043/025* (2013.01); *B29C 2043/3222* (2013.01); *B29C 2043/3652* (2013.01); *B29C 2043/5866* (2013.01)

(56) References Cited

U.S. PATENT DOCUMENTS

| | | | |
|---|---|---|---|
| 8,215,946 B2* | 7/2012 | Ganapathisubramanian | B82Y 10/00 425/400 |
| 8,857,805 B2* | 10/2014 | Lackner | H01L 21/683 269/289 R |
| 9,372,396 B2 | 6/2016 | Kruijt-Stegeman et al. | |
| 9,375,872 B2 | 6/2016 | Miyata | |
| 9,387,607 B2 | 7/2016 | Matsumoto et al. | |
| 2001/0013772 A1* | 8/2001 | Sugiyama | G01R 31/2891 324/750.03 |
| 2003/0073381 A1* | 4/2003 | Mallery | H01L 21/67253 451/5 |
| 2004/0245700 A1* | 12/2004 | Asada | B41J 11/0085 271/109 |
| 2005/0019980 A1* | 1/2005 | Kurosawa | H01L 21/67132 438/107 |
| 2010/0096774 A1 | 4/2010 | Kruijt-Stegeman et al. | |
| 2012/0139192 A1* | 6/2012 | Ooi | B25B 11/005 279/3 |
| 2012/0274006 A1* | 11/2012 | Matsumoto | B29C 43/021 264/571 |
| 2012/0288353 A1* | 11/2012 | Jin | H01L 21/68707 414/752.1 |
| 2013/0056904 A1 | 3/2013 | Hamaya et al. | |
| 2014/0208557 A1* | 7/2014 | Sugihara | H01L 21/67092 29/281.4 |
| 2014/0209230 A1* | 7/2014 | Wagenleitner | H01L 21/67092 156/60 |
| 2014/0305904 A1* | 10/2014 | Lan | H01L 33/0095 216/40 |
| 2015/0131072 A1* | 5/2015 | Meissl | G03F 7/0002 355/73 |
| 2015/0228528 A1* | 8/2015 | Behdjat | H01L 21/6838 219/392 |

FOREIGN PATENT DOCUMENTS

| | | |
|---|---|---|
| JP | 2010269580 A | 12/2010 |
| JP | 2012234913 A | 11/2012 |
| JP | 2015012033 A | 1/2015 |
| KR | 1020010082138 A | 8/2001 |
| KR | 1020130059293 A | 6/2013 |
| WO | 2006083520 A2 | 8/2006 |
| WO | 2007126767 A2 | 11/2007 |
| WO | 2010047788 A2 | 4/2010 |

OTHER PUBLICATIONS

Written Opinion issued in Intl. Appln. No. PCT/JP2015/001970, dated Jul. 14, 2015.

Office Action issued in Korean Appln. No. 10-2016-7027296 dated Aug. 10, 2017. English translation provided.

Office Action issued in Chinese Appln. No. 201580017358.8 dated May 4, 2018. English Translation provided.

* cited by examiner

[Fig. 1]
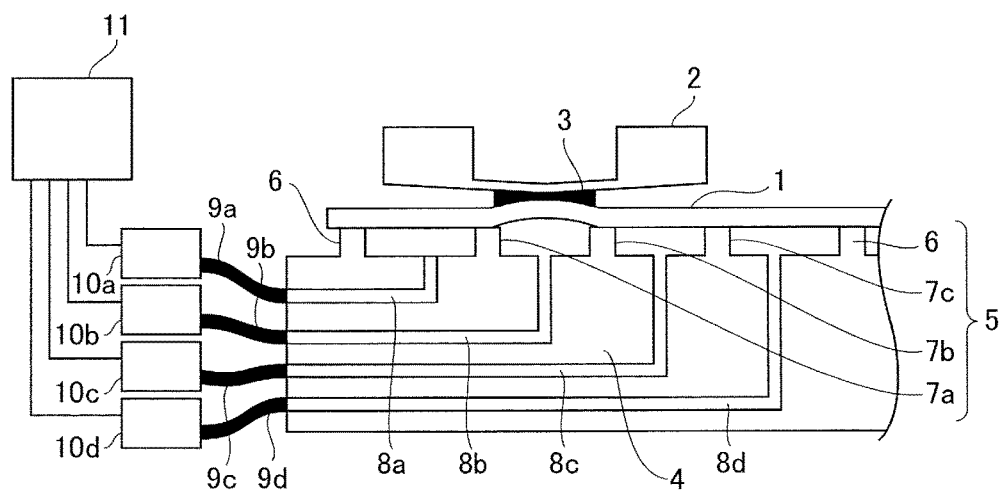
[Fig. 2]
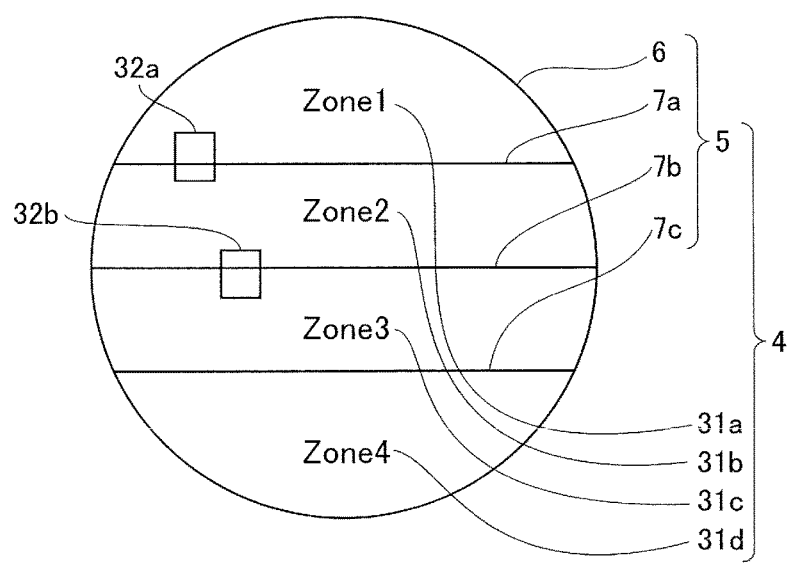

[Fig. 3]
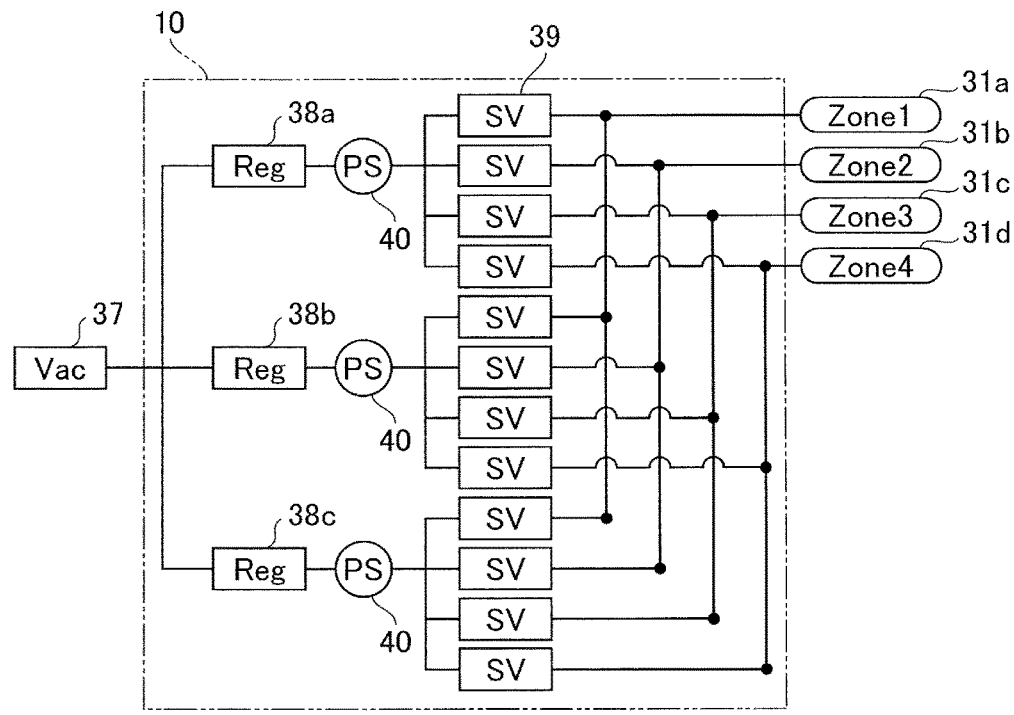
[Fig. 4]
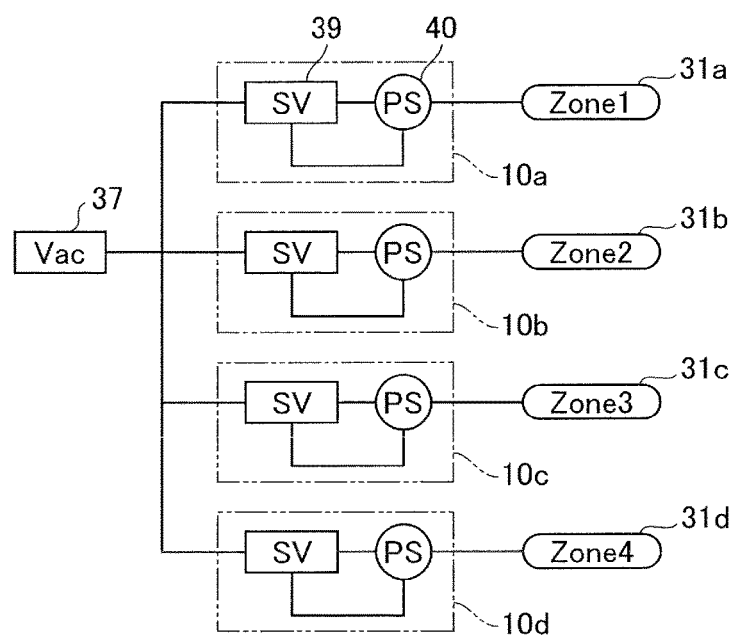

[Fig. 5]
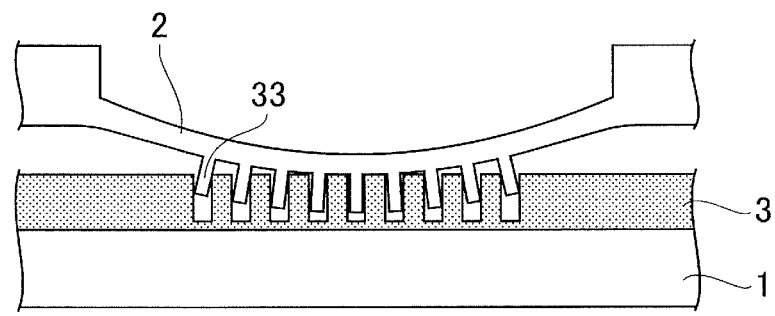
[Fig. 6]
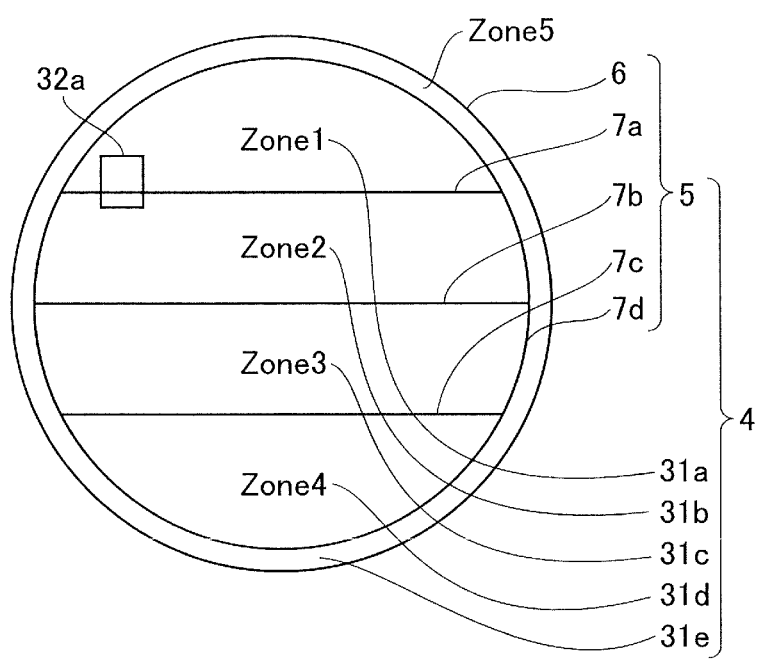

[Fig. 7]
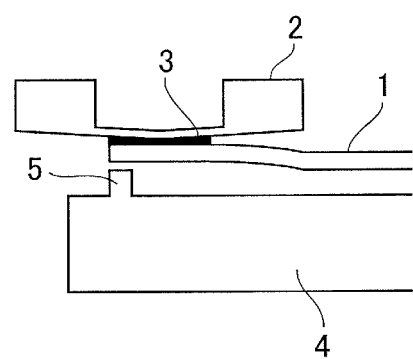
[Fig. 8]
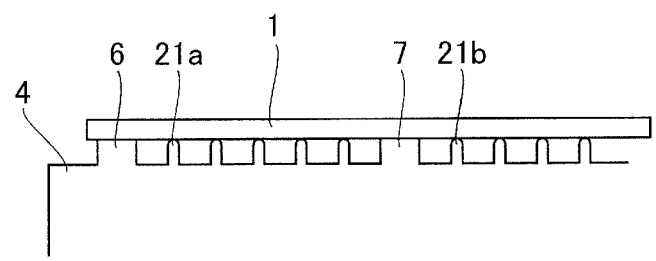

[Fig. 9]
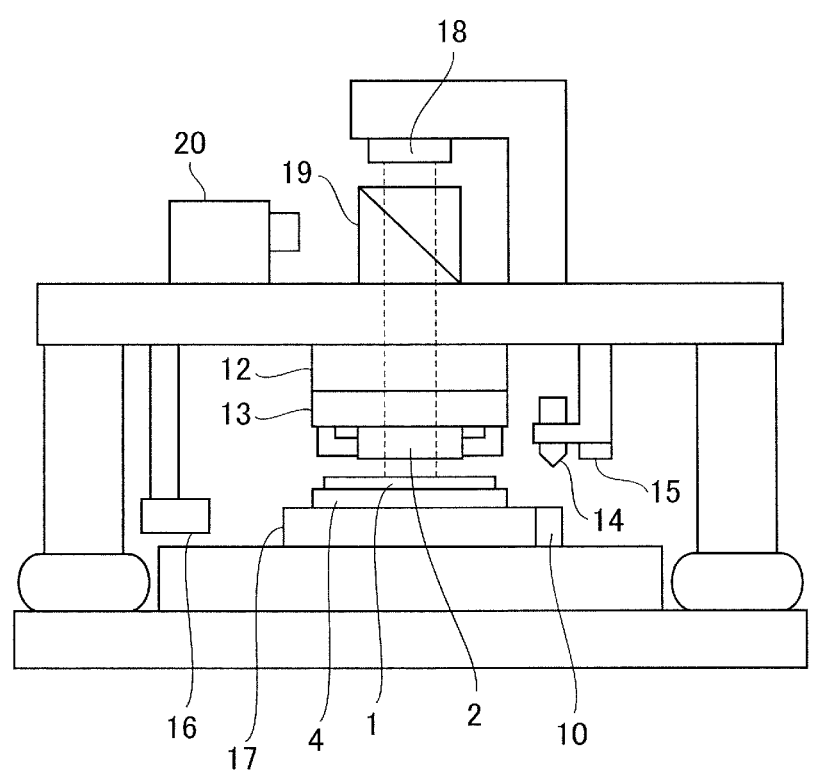

IMPRINT APPARATUS AND ARTICLE MANUFACTURING METHOD

TECHNICAL FIELD

The present invention relates to an imprint apparatus and an article manufacturing method.

BACKGROUND ART

The demand for micronization of semiconductor devices, MEMSs and the like has increased, and in addition to the conventional photolithography technologies, microfabrication technology has attracted attention, in which uncured resin applied on a substrate (wafer) is molded by using a mold and a pattern is formed on the substrate. This technology is referred to as "imprint technology" and a fine structure can be formed on the substrate in several nanometers order. One example of the imprint technology is a photo-curing method. In an imprint apparatus that uses this photo-curing method, firstly, uncured resin (photo-curable resin) is applied in a patterning area on the substrate. Next, the resin on the substrate is contacted with a mold formed a pattern (mold pressing). And then, light is irradiated to cure the resin in a contacted state with the mold. The distance between the resin and the mold is increased (the mold is released from the cured resin) to form the pattern of the resin on the substrate.

An imprint apparatus using the above technology may cause distortion of the pattern formed in the resin due to stress generated in releasing the mold from the resin. Thus, a patent literature 1 discloses an imprint apparatus that divides an electrostatic suction unit of a substrate holding device into a plurality of suction blocks to allow a controller to switch on/off of suction force partly. In the patent literature 1, it is described that the resin is released from the mold, and then the suction force in a portion of the suction blocks is set to "off" to attenuate residual stress in the substrate. Also, a patent literature 2 discloses an imprint apparatus that divides a suction area of a substrate holding device to allow a controller to gradually adjust suction force in each divided area. In the disclosure of the patent literature 2, the suction force in a part of the divided areas is temporarily set to be reduced after releasing the mold from the resin (set the level of the suction force to be "small") to attenuate residual stress. In addition, the patent literature 2 discloses that the suction force is set such that a part of a shot adjacent to a shot which is in contact with the mold in releasing the mold from the resin floats from a suction unit (set the level of the suction force to be "middle") to reduce occurrence of collapse of the pattern.

CITATION LIST

Patent Literature

Patent literature 1: Japanese Patent Laid-Open No. 2010-098310

Patent literature 2: Japanese Patent Laid-Open No. 2012-234913

Displacement of a substrate may be caused or a resin may not release from a mold in an imprint apparatus that sets the suction force in a part of suction areas to be reduced when the mold is released from the resin, if force required for the release (releasing force) exceeds force holding the substrate. For example, if a shot area (an area to be processed on the substrate in one pressing) extends over adjacent two suction areas, force enough to hold the substrate cannot be obtained when the suction forces in these two suction areas is reduced. In this case, the simple increase of the suction force in the other suction areas has a disadvantage for a cost of the apparatus and throughput in operation. Also, in the patent literature 1 and the patent literature 2 in which a plurality of suction areas are arranged along a predetermined direction, the held substrate may be easily released from the substrate holding device, if suction force of the suction area located at the edge in the arranged direction is set to be small.

The present invention provides, for example, an imprint apparatus that is advantageous for suppressing displacement or release of a substrate in releasing a mold, to suppress distortion of a pattern and the like.

SUMMARY OF INVENTION

According to a first aspect of the present invention, for contacting a resin applied to a substrate with a mold to perform patterning on the substrate is provided, the imprint apparatus comprising: a substrate holding unit for holding the substrate, wherein the substrate holding unit comprises a plurality of holding areas arranged in a predetermined direction, the plurality of holding areas has different width dimension in the direction respectively based on positions in the direction, and a surface ratio between two holding areas of the plurality of holding areas with different width dimension respectively is within a range of 0.8 to 1.2. According to a second aspect of the present invention, an imprint apparatus for contacting a resin applied to a substrate with a mold to perform patterning on the substrate with the resin is provided, the imprint apparatus comprising a substrate holding unit for holding the substrate, wherein the substrate holding unit comprises: a plurality of holding areas arranged in a predetermined direction and defined by a straight boundary; and a periphery holding area located around the plurality of holding areas.

The present invention can provide, for example, an imprint apparatus that is advantageous for suppressing displacement or release of a substrate in releasing a mold, to suppress distortion of a pattern and the like.

BRIEF DESCRIPTION OF DRAWINGS

FIG. 1 illustrates a schematic configuration of an imprint apparatus enable to apply a substrate holding device according to a first embodiment of the present invention.

FIG. 2 illustrates an exemplary configuration of a suction area of a substrate holding device according to the first embodiment.

FIG. 3 illustrates an exemplary configuration of a pressure adjusting device for controlling pressure of a suction area of a substrate holding device according to the first embodiment.

FIG. 4 illustrates another exemplary configuration of a pressure adjusting device according to the first embodiment.

FIG. 5 illustrates a state in releasing.

FIG. 6 illustrates an exemplary configuration of suction areas of a substrate holding device according to a second embodiment of the present invention.

FIG. 7 illustrates a state of a substrate in releasing.

FIG. 8 illustrates an exemplary configuration of a substrate holding device for supporting a substrate with support parts FIG. 9 illustrates a schematic configuration of another imprint apparatus enable to apply a substrate holding device according to the present invention.

DESCRIPTION OF EMBODIMENTS

Hereinafter, preferred embodiments of the present invention will be described with reference to the drawings.

First Embodiment

Firstly, a description will be given of an imprint apparatus enable to apply a substrate holding device according to a first embodiment of the present invention thereto. FIG. 1 is a schematic diagram illustrating a configuration of an imprint apparatus according to the present embodiment. The imprint apparatus is used in manufacture of devices such as semiconductor devices as an article and contacts an uncured resin 3 applied to a substrate (wafer) 1 with a concave and convex pattern formed on a surface of a mold 2 to transfer a reversed image of the pattern on the substrate 1. The imprint apparatus shown in FIG. 1 comprises a substrate holding device (substrate holding unit) 4 for holding (fixing) the substrate 1, a mold 2 arranged opposite to the substrate holding device 4, and a controller 11 for controlling the whole apparatus. The substrate holding device 4 according to the present embodiment is configured to divide a suction area (holding area) for holding the substrate 1 with the suction into a plurality of parts with a plurality of partitions to adjust pressure with respect to each divided suction area. In this embodiment, a description will be given of an example for dividing the suction area of the substrate 1 into four parts. More specifically, the substrate holding device 4 comprises partitions 5 (an periphery partition 6 and internal partitions 7a-7c), through holes 8a-8d, pipes 9a-9d, and pressure adjusting devices 10a-10d. The periphery partition 6 is formed at a position corresponding to a periphery of the substrate 1 in a plane of the substrate holding device 4 opposed to the mold 2. The internal partitions 7a-7c whose height are same as the periphery partition 6 are formed inside of the periphery partition 6. For example, as shown in FIG. 2, each area is plenary closed by each partition and forms one or more independent closed spaces (suction areas) when the areas covered with the substrate 1. Each of the closed spaces is respectively connected to the pressure adjusting devices 10a-10d through the pipes 9a-9d. These pressure adjusting devices 10a-10d are connected to a vacuum pump and a compressor (not shown) to enable to switch the atmospheric pressure inside of each enclosed space continuously. The controller 11 can synchronize a process in an imprinting step (patterning step) to instruct the pressure adjusting devices 10a-10d to adjust the pressure in the enclosed spaces to adjust the local suction force for the substrate 1.

Next, a detailed description will be given of an exemplary configuration of the suction area of the substrate holding device 4 as described above. FIG. 2 illustrates an exemplary configuration of the suction area of the substrate holding device 4 according to the present invention in detail. As shown in FIG. 2, the suction area of the substrate holding device 4 according to the present embodiment are defined by three internal partitions 7a-7c that are formed liner shape parallel to each other and are arranged in the predetermined direction so as to connect to the periphery partition 6. The suction area is divided into four suction areas 31a (Zone 1)-31d (Zone 4). In the present embodiment, the suction area of the substrate holding device 4 is divided, taking surface ratio thereof into consideration. Note that the divided shape including the number of the divided suction area is not limited to that of embodiments of this invention. A plurality of suction areas may be arranged in the predetermined direction, for example, by means of finely dividing the suction area and arranging the suction areas in lattice shape. For example, instead of the configuration of FIG. 2, Zones 1-4 may as well be arranged in a concentric fashion.

Hereinafter, a description will be given of a reason why it is useful to identify the suction areas of the substrate holding device 4 described above by the surface ratio thereof, while comparing to a case for identifying the suction areas by the space thereof. In this embodiment, for example, an outer diameter of the substrate 1 has 300 mm of the diameter (note that the outer diameter is actually set to be 0.1 mm to 0.5 mm shorter than 300 mm considering a tolerance of outer diameter of the substrate 1). In such a substrate 1, the width dimension (space) between the suction areas 31a and 31d is 89.4 mm. Here, the term "the width dimension of between the suction areas 31a and 31d" is a maximum distance from the internal partition 7a and the internal partition 7c to the periphery partition 6. Also, the width dimension between the suction areas 31b and 31c (distance from the internal partition 7a and the internal partition 7c to the internal partition 7b) is 60.6 mm.

In this embodiment, a description will be given of an exemplary case for dividing the suction area of the substrate holding device 4 into a plurality of parts that have same area respectively as shown in FIG. 2, while comparing to a case for dividing the suction area at equal interval. Each surface ratio P when dividing the circular suction area with the parallel lines at equal interval is determined to be 61, 96, 96, 61 respectively and each narrower area becomes narrower by 36% compared to each wider area. For example, each area of the substrate with 300 mm of the outer diameter is determined to be 138 cm2, 215 cm2, 215 cm2, and 138 cm2, if the suction area is divided at equal interval. In contrast, if the suction area is divided into a plurality of parts that have same area respectively, all divided areas are determined to be 177 cm2. All of the width dimensions of each suction area divided at equal interval are determined to be 75 mm. In contrast, if the suction area is divided into the plurality of parts that have same area respectively, each width dimension is determined to be 89.41 mm, 60.59 mm, 60.59 mm, and 89.41 mm respectively and varied depending on each position in the direction. Here, the suction area is determined to be 276 cm2 if it is divided at equal interval, and it is determined to be 354 cm2 if it is divided into a plurality of parts that have same area respectively, since the substrate is held in two areas at the periphery side spaced apart from the center of the circle, if there is a shot in two areas placed at the center side of the circle. Accordingly, the surface ratio of the suction area is determined to be 1.3 between division of the suction area into the plurality of parts that have same area respectively and division at regular interval, and the suction force when divided into the plurality of parts that have same area respectively is 1.3 times stronger than that of the division at equal interval. Therefore, when the suction area is divided by using the above method, a shot area is not over 3 or more the suction areas, since magnitude of the shot area (at most, distance of the diagonal line) is less than that of each suction area. In other words, the shot area is over at most two suction areas. For example, if a shot area 32b is extended over the suction areas 31a and 31b as shown in FIG. 2, the internal pressure of the suction areas 31a and 31b in releasing is switched to be increased to weaken the suction force (holding force). In this case, the internal pressure of the suction areas 31c and 31d remains the values that generate the normal suction force. In other words, ½ areas or more of the whole substrate 1 can always be held with the larger suction force. While a description is given of a case when the suction area of the substrate holding device 4 is divided into a plurality of parts that have same area respectively, this invention is not limited thereto, but the suction area may be divided into a plurality of parts that have closely same area respectively. More specifically, in the plurality of suction areas of the substrate holding device 4, the surface ratio P of two suction areas that have different width dimension from each other is preferably in a range of 0.8 to 1.2, and more preferably, a range of 0.9 to 1.1. Such a range of the surface ratio allows the ½ areas or more of the whole substrate 1 to be set as the suction area.

According to the substrate holding device described above, the release of the substrate 1 from the substrate holding device 4 can be suppressed efficiently, since the ½ areas or more of the whole substrate 1 is enable to be set as the suction area at all times. For example, since the substrate 1 is held with 176 N of the suction force if the suction is performed with the −50 kPa of negative pressure, the release of the substrate 1 from the substrate holding device 4 can be suppressed even if 10 N to 100 N of the releasing force of the mold 2 is generated.

Next, a description will be given of a configuration and an operation of a pressure adjusting device 10 for adjusting pressure of each suction area of the substrate holding device 4 described above. FIG. 3 illustrates a configuration of a pressure adjusting device 10 according to the present embodiment. As shown in FIG. 3, a pressure reducing device (source of the suction force) 37 generates −100 kPa of negative pressure. The source of the suction force 37 is connected to the pressure adjusting device 10 through a pipe. This pipe branches off into a plurality of systems in the pressure adjusting device 10 and is connected to regulators 38a-38c. Each regulator alters pressure supplied as −100 kPa of the negative pressure to each outlet pressure, for example, the regulator 38a alters the pressure to −90 kPa of outlet pressure, the regulator 38b alters it to −50 kPa of outlet pressure, and the regulator 38c alters it to −10 kPa of outlet pressure. These pipes at the exits of the regulators branches off into the number of the divided suction areas 31, and each pipe is connected to a Zone 1, a Zone 2, a Zone 3, and a Zone 4 through switching devices 39. In the above configuration, the controller 11 instructs the switching devices 39 to perform to switch open or close of the switching devices 39 after classifying the original pressure into three types of the values of −90 kPa, −50 kPa, and −10 kPa. Therefore, the respective internal pressure of the suction areas can be switched into any of three types of the values of the pressure.

Note that the pressure adjusting device according to the present embodiment is not limited within the configuration as shown in FIG. 3. For example, a pressure adjusting device 10 as shown in FIG. 4 may be used. A source of the suction force 37 of the pressure adjusting device 10 as shown in FIG. 4 also generates −100 kPa of negative pressure like the case shown in FIG. 3. In the pressure adjusting device 10 as shown in FIG. 4, a pipe connected to the source of the suction force 37 branches off into four systems and each of the branched pipes is connected to pressure adjusting devices 10a-10d. Each of the pressure adjusting devices 10a-10d comprises a servo valve (switching device 39) inside thereof and has a function for controlling supplied pressure into pressure different from the supplied pressure such that each value of pressure sensors 40 matches a instructed value received from a controller (not shown). The pressure adjusting devices 10a-10d are connected to the suction areas 31a-31d to enable to control each internal pressure of the suction areas 31a-31d into the values that are different from each other.

If the imprint apparatus according to the present embodiment is used in an imprint step, it takes 1-5 second(s) to perform pressing step and releasing step respectively. Also, it may takes 0.5 seconds or less depending on the types to complete the pressing step and the releasing step in order to improve efficiency for the manufacture. Accordingly, the pressure of the suction areas within the substrate holding device 4, and the pressure within the pipes 9 is required to be altered immediately and correctly at a timing for shifting to the releasing step. Therefore, more preferably, an equipment with 0.1 seconds or less of responsiveness may be selected as the pressure adjusting devices 10 as shown in FIG. 3 and FIG. 4. Also, more preferably, an accumulator or a buffer tank may be arranged in each branched pipe or the pre-branched pipe such that the other pipe is not affected by pressure due to the operation of the switching device 39 to be objected. In addition, preferably, if the controlled pressure comprises a range of normal pressure as well as the negative pressure, a function for switching a vacuum source and a source of the compressed air may be added.

Now, if the configuration of the imprint apparatus according to the present embodiment is not employed like the previous configuration, the following states can be occurred at releasing the resin from the substrate. These states will be described with reference to FIG. 5. Firstly, the resin 3 on the substrate 1 is solidified at a state that the resin 3 is inserted into the pattern 33 formed on the substrate 1. Therefore, when the mold 2 is lifted for the releasing, force is required to release the pattern 33 from the whole solidified resin 3 inserted into the pattern 33 formed on the substrate 1. The thin part of the mold 2 is deformed and then, in general, stress concentration is generated the periphery of the pattern 33, the releasing starts from the periphery generating the stress concentration, and the releasing expands to the entire surface immediately. At this time, distortion of the pattern 33 occurs at the part that the stress concentration is generated, and the distribution of the distortion expands as the releasing expands. As described above, a large force of 100 N to 500 N is required to release the resin 3 from the mold 2 and the distortion is remained immediately after the releasing. In a position of a semiconductor element performing the releasing, a shape of a chip is deformed. Furthermore, the adjacent position is deformed, since the adjacent position is affected by this deformation of the shape thereof.

In contrast, in the present embodiment, the pressure of each suction area of the substrate holding device 4 can be adjusted separately by using the pressure adjusting device 10 to weaken the local suction force of the substrate 1 with respect to the position corresponding to the released part immediately before starting the releasing step on the substrate 1. Thereby, the substrate 1 is locally lifted in a releasing direction as shown in FIG. 1 and force in the releasing direction is set to be in an equilibrium state at the sides of the mold 2 the substrate. At this time, since the substrate 1 and the mold 2 are deformed into convex shapes respectively at the periphery contacting the substrate 1 and the mold 2 via the resin 3, the releasing occurs easily at the periphery of the contacting part. Accordingly, while the large releasing force of 100 N to 500 N as described above has been required if the whole surface of the contacting part is released at once, the state that the releasing from the periphery is easily occurred is created to enable to perform a graduate releasing with ½ to 1/10 of the previous force.

Also, as shown in FIG. 5, the mold 2 may be preferably deformed in the convex shape toward the side of the substrate by previously introducing compressed gas to a surface opposed to the pattern surface of the mold 2 immediately before the releasing step in order to further reduce the force required for the releasing. This enables to accelerate an event for generating the gradual releasing from the periphery of the pattern 33.

Note that, in the first embodiment as described above, a description is given of the divided areas of the suction area in the substrate holding device 4 and the control of the pressure adjusting device 10. However, this invention is not limited thereto. For example, the area near the periphery of the suction area may be circular. More specifically, another configuration is described in a second embodiment as following.

Second Embodiment

Next, a description will be given of an imprint apparatus enable to apply a substrate holding device according to a second embodiment of the present invention thereto. The whole configuration of the imprint apparatus in the present embodiment is similar to that shown in FIG. 1. In this embodiment, a detailed description will be given of another example of the suction area of the substrate holding device 4. FIG. 6 illustrates an exemplary configuration of a suction area of the substrate holding device 4 according to the present embodiment in detailed. As shown in FIG. 6, the substrate holding device according to the present embodiment comprises a suction area 31e (Zone 5) as a periphery holding area that is disposed around each suction area 31a-31d divided into four parts as described in the first embodiment. The above point differs from the configuration of the first embodiment. It is noted that same reference numerals are provided to each of the same components according to the present embodiment as each of the components in the first embodiment, and the description thereof will be omitted. Furthermore, in the present embodiment, a description will be given of a case that the similar configuration to that of the first embodiment is used as the suction areas disposed within the periphery holding area, however, the configuration is not intended to limit this invention. In the suction areas disposed within the periphery holding area, a plurality of suction areas defined by straight boundaries may be arranged in a predetermined direction, and for example, a plurality of suction areas may be arranged in a horizontal direction or in a lattice shape.

Such a substrate holding device 4 can prevent the substrate 1 from being released from the substrate holding device 4 by increasing the suction force of the periphery holding area 31e at all times. For example, as shown in FIG. 6, even if a shot area 32a is placed near the periphery of the substrate holding device 4, and there is large distance from a part with a large suction force (suction area 31c and 31d), the substrate can be held by the periphery holding area 31e. Also, as shown in FIG. 7, an outside part of the periphery of the substrate holding device 4 cannot be intolerable to the releasing force and the substrate 1 can be released from the substrate holding device 4, since the suction force to the substrate 1 does not work at the outside part of the periphery of the substrate holding device 4. According to the present embodiment, such an event can be suppressed by suctioning the periphery holding area 31e, even if the suction force of the suction area at the edge in the arranged direction of the suction area is reduced.

In a releasing step of an imprinting step, a releasing force required to release the pattern 33 from the resin 3 is determined depending on a variety of factors such as materials of the resin 3, solidifying methods, materials of the mold 2, and a processed state of the pattern 33, or performance or releasing speed of a releasing agent to be used. Therefore, it is difficult to easily determine the releasing force. As described above, the substrate 1 can be released from the substrate holding device 4 due to the intolerance of the substrate 1 to the releasing force. At this time, the closed spaces formed by the substrate 1 and the partition 5 (the periphery partition 6 and an internal partition 7) are disrupted, and the suction force by the negative pressure is further reduced to cause expansion of the releasing. Thus, the pressure adjusting device 10 as shown in FIG. 1 can further comprises a function for determining the abnormal releasing by monitoring the change of the state of the negative pressure.

While the suction area 31 of the substrate holding device 4 can control the suction force at the closer position by the state for the location of the shot area, if the suction area is finely divided, finely division can increase the cost for the manufacture or can require complex control as the divided number increases. On the other hand, if the divided number is small and the suction area is large, the surface of the substrate 1 can be bent to the side of the substrate holding device 4 due to the negative pressure. While the areas divided with the parallel lines respectively are the four parts in the first and the second embodiments, the divided number is not limited thereto. Further, for example, some support parts may be arranged in addition to the partitions. As shown in FIG. 8, a plurality of cylindrical-shaped support parts 21a and 21b with diameters less than or equal to 1 mm are arranged in the suction area (holding area) in addition to the periphery partition 6 and the internal partition 7. The height of these support parts 21a and 21b is same as that of the periphery partition 6 and the internal partition 7, and a ridgeline at the end surface of the cylinder is rounded in order not to provide damage to the surface of the substrate 1.

Note that a description is given of methods for generating the negative pressure between the substrate 1 and the substrate holding device 4 to suction the substrate 1 and switching the negative pressure for each suction area 31 divided into a plurality of parts in the imprinting step, in the first and the second embodiments. However, the means for generating the suction force is not limited to the use of the negative pressure. Electrostatic suction or magnetic suction may be used as the means for generating the suction force.

Note that the imprint apparatus as shown in FIG. 1 is not intended to limit the present invention as the imprint apparatus enable to apply the substrate holding device according to the present invention thereto. Here, a description will be given of another imprint apparatus enable to apply the substrate holding device according to the present invention thereto. FIG. 9 illustrates a schematic configuration of another imprint apparatus enable to apply a substrate holding device according to the present invention thereto. It is noted that same reference numerals are provided to each of the same components of the imprint apparatus shown in FIG. 9 as each of the components shown in FIG. 1, and the description thereof will be omitted. The imprint apparatus shown in FIG. 9 comprises an imprint head 12, a mold holding device 13, a dispenser 14, a height measuring device 15, an interferometer 16, a substrate stage 17, a light source device 18, an optical system 19 and an observing device 20. As shown in FIG. 9, the substrate holding device 4 is placed on the substrate stage 17 and the substrate 1 is suctioned on the substrate holding device 4.

Next, a description will be given of an imprinting step. In the imprinting step, an alignment mark formed on the substrate 1 is observed with an alignment optical system (not shown) to obtain information about the displacement of the position. Also, the height measuring device 15 correctly measures a distance from the height measuring device 15 to the upper surface of the substrate 1. On the other hand, the mold 2 is held by the mold holding device 13 and the relative height between the pattern surface of the mold 2 and the height measuring device 15 is measured in advance to allow the distance from the surface of the substrate 1 facing the mold to the pattern surface of the mold 2 to be calculated. Next, the resin 3 is applied to the surface of the substrate 1 by the dispenser 14, and the whole imprint head 12 is descended until the position that the surface of the substrate 1 facing the mold contacts with the pattern surface of the mold 2 to contact the substrate 1 with the mold 2 tightly. The imprint head 12 comprises a vertical movement actuator (not shown) and a measuring device for measuring moving distance inside thereof, and the descending distance is measured in the imprint head 12. Also, since the vertical movement actuator in the imprint head 12 always monitors the driving force, it can determine resistance force applied in the imprint head 12 as a measuring unit configured to measure a value corresponding force for releasing the mold from the resin. After contacting the substrate 1 with the mold 2, ultraviolet rays emitted from the light source device 18 is irradiated to the mold 2 through the optical system 19. The resin 3 is irradiated with the ultraviolet rays transmitting the mold 2 to be solidified, since the mold 2 comprises a material capable of transmitting the ultraviolet rays such as quartz materials. When the solidification of the resin 3 is completed, the step is started in which the mold 2 is released from the resin 3. While the substrate 1 is suctioned to the substrate holding device 4 with 50 N to 300 N of the force in the pre-releasing step, the suction force in the imprinting area only is switched in the releasing step. Firstly, the controller 11 applies the pressure by transmitting the compressed air to the side facing the pattern of the mold 2 in the imprint head 12, and thereby deforms the pattern surface of the mold 2 so as to be a convex shape toward the side of the substrate 1 as shown in FIG. 1. Simultaneously, the vertical movement actuator receives an instruction to lift the imprint head 12 from the controller 11. At this time, the molds 2 starts to release from resin 3, and the releasing force becomes resistance force and is detected by the vertical movement actuator. The controller 11 synchronizes the occurrence of the resistance force to reduce the suction force of the suction area corresponding to the shot area 32 to the predetermined value to allow the substrate 1 to be deformable as shown in FIG. 1 and to weaken the releasing force. As the ratio of increase of the resistance force to the drive amount for lifting the imprint head 12 that represents a start of the resistance force at the beginning of the releasing is higher, the stress concentration is generated more easily, and thereby the distortion of the pattern or the like is occurred more easily. Therefore, it is more preferable that a method for weakening the suction force of each suction area may be controlled depending on the value of the resistance force or the ratio of increase.

Also, if the resistance force exceeds the suction force of the substrate 1 in addition to the weakening of the suction force of the suction area, the whole substrate 1 can be released from the substrate holding device 4 when the resistance force applied to the imprint head 12 at the releasing step is generated. Accordingly, the suction force may be controlled to be increased with respect to the value of the resistance force and the ratio of increase, as well as the method for weakening the suction force of each suction area may be controlled as mentioned above, since the suction force applied to the whole substrate 1 is required to be increased before the resistance force exceeds the suction force.

When the suction force of the substrate holding device 4 is adjusted, the measured value used as the value concerning the force for releasing the resin from the mold is not limited to the force applied at the releasing as described above. For example, the releasing state of the substrate 1 and the mold 2 may be observed to measure the change of its state and to adjust the suction force based on the measured result. In FIG. 9, the observing device 20 as the measuring unit is an imaging apparatus, and can observe the mold 2 through the optical system 19 from a direction opposed to the pattern surface of the mold 2. The mold 2 comprises materials that are transparent to the visible light, such that the mold 2 transmits the visible light and the resin 3 as well as the substrate 1 is observed. As described above, it takes 1 to 5 second(s) to gradually complete the whole releasing in the releasing step, however, an area of a portion that the resin 3 contacts with the mold 2 is reduced gradually during the releasing step. The border between the contacting part and the releasing part can be observed with the observing device 20, since this resin 3 has a certain refractive index to the visible light. The position of the gravity center and the shape for the contacted part as well as the change of the area of the contacted part can be obtained from the image observed by such a method. If the resistance force applied to the above imprint head is measured, the whole amount of the resistance force is measured, however, the coordinates of the contacting part can be obtained if it is observed by the observing device 20. Therefore, it can be determined where the suction force is adjusted on the substrate holding device 4 based on the coordinates to enable to adjust the more accurate suction force. Also, the method for adjusting a suction pressure comprises classifying the result of the observation obtained in advance to patterns, acquiring the optimal suction pressure depending on each patterns by an experiment, and storing these values to the controller 11.

As described above in detail, when the solidified resin on the substrate 1 is released the area weakening the suction force of the substrate holding device 4 is locally lifted to remain the equilibrium state between the releasing force and the suction force in the imprint apparatus comprising the substrate holding device 4 according to the first and the second embodiments. Therefore, in the step for releasing the mold, the displacement or the releasing of the substrate can be suppressed and thereby the distortion of the pattern or the like can be suppressed. Also, since the residual stress generated in the substrate 1 can be suppressed, friction force generated between the substrate 1 and the substrate holding device 4 can be reduced, and wounds generated on the both surfaces can be suppressed even if the slipping is generated between the substrate 1 and the substrate holding device 4 due to the deformation of the substrate 1. In addition, when the substrate 1 lifted locally is re-suctioned to the substrate holding device 4, the occurrence of the wound or the crack on the surface of the substrate 1 can be also suppressed, since the suction force is weak to cause the impact of the contact to be weaken.

(Article Manufacturing Method)

Note that a method for manufacturing a device (semiconductor integrated circuit element, liquid crystal display element, or the like) as an article described above may include a step of forming a pattern onto a substrate (wafer, glass plate, film-like substrate) by using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of this embodiment has an advantage, as compared with a conventional device manufacturing method, in at least one of performance, quality, productivity and production cost of articles.

While the present invention has been described with reference to exemplary embodiments, it is to be understood that the invention is not limited to the disclosed exemplary embodiments, and encompasses all such modifications and equivalent structure and functions.

This application claims the benefit of Japanese Patent Application No. 2014-079980 filed Apr. 9, 2014, which is hereby incorporated by reference herein in its entirety.

The invention claimed is:

1. An imprint apparatus for contacting a resin applied to a substrate with a mold to perform patterning on the substrate, the imprint apparatus comprising:
    a substrate holding unit for holding the substrate,
    wherein the substrate holding unit comprises a plurality of holding areas arranged in a predetermined direction,
    the plurality of holding areas has a different width dimension in the predetermined direction respectively based on positions in the predetermined direction, and
    a surface area ratio of a surface area of a widest area of the plurality of holding areas and a surface area of a narrowest area of the plurality of holding areas is within a range of 0.8 to 1.2.

2. The imprint apparatus according to claim 1, wherein the plurality of holding areas are linearly arranged, and the substrate holding unit comprises a periphery holding area located around the plurality of holding areas.

3. The imprint apparatus according to claim 2, wherein the plurality of holding areas is configured such that a width dimension of a holding area configured to be disposed at a center portion of the substrate in the predetermined direction is smaller than a width dimension of a holding area configured to be disposed at a peripheral portion of the substrate.

4. The imprint apparatus according claim 3, wherein the substrate holding unit is configured to hold the substrate by using negative pressure.

5. The imprint apparatus according to claim 3, further comprising a measuring member configured to measure a value related to a force for releasing the mold off the resin in patterning,
    wherein the substrate holding unit is configured to adjust respective holding forces of the plurality of holding areas based on the result measured by the measuring unit.

6. The imprint apparatus according to claim 3, wherein the substrate holding unit comprises a plurality of supporting units for contacting the substrate.

7. The imprint apparatus according claim 2, wherein the substrate holding unit is configured to hold the substrate by using negative pressure.

8. The imprint apparatus according to claim 2, further comprising a measuring member configured to measure a value related to a force for releasing the mold off the resin in patterning,
    wherein the substrate holding unit is configured to adjust respective holding forces of the plurality of holding areas based on the result measured by the measuring unit.

9. The imprint apparatus according to claim 2, wherein the substrate holding unit comprises a plurality of supporting units for contacting the substrate.

10. The imprint apparatus according to claim 1, wherein the substrate holding unit is configured to hold the substrate by using negative pressure.

11. The imprint apparatus according to claim 10, further comprising a measuring member configured to measure a value related to a force for releasing the mold off the resin in patterning,
    wherein the substrate holding unit is configured to adjust respective holding forces of the plurality of holding areas based on the result measured by the measuring unit.

12. The imprint apparatus according to claim 10, wherein the substrate holding unit comprises a plurality of supporting units for contacting the substrate.

13. The imprint apparatus according to claim 1, further comprising a measuring member configured to measure a value related to a force for releasing the mold off the resin in patterning,
    wherein the substrate holding unit is configured to adjust respective holding forces of the plurality of holding areas based on the result measured by the measuring unit.

14. The imprint apparatus according to claim 1, wherein the substrate holding unit comprises a plurality of supporting units for contacting the substrate.

15. A method of manufacturing an article, the method comprising steps of:
    performing patterning on a substrate with a resin by an imprint apparatus; and
    processing the patterned substrate,
    wherein the imprint apparatus comprises:
        a substrate holding unit for holding the substrate,
        wherein the substrate holding unit comprises a plurality of holding areas arranged in a predetermined direction,
        the plurality of holding areas has a different width dimension in the predetermined direction respectively based on positions in the predetermined direction, and
        a surface area ratio of a surface area of a widest area of the plurality of holding areas and a surface area of a narrowest area of the plurality of holding areas is within a range of 0.8 to 1.2.

* * * * *